US 7,990,173 B1

(12) United States Patent
Tseng et al.

(10) Patent No.: US 7,990,173 B1
(45) Date of Patent: Aug. 2, 2011

(54) SINGLE EVENT UPSET MITIGATION

(75) Inventors: Chen W. Tseng, Longmont, CO (US);
Carl H. Carmichael, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/725,324

(22) Filed: Mar. 16, 2010

(51) Int. Cl.
*H03K 19/003* (2006.01)
*H03K 19/007* (2006.01)
(52) U.S. Cl. .......................... 326/11; 326/14
(58) Field of Classification Search ............... 326/10–14
See application file for complete search history.

(56) References Cited

U.S. PATENT DOCUMENTS

| 6,624,654 | B1 | 9/2003 | Trimberger |
| 7,036,059 | B1 | 4/2006 | Carmichael et al. |
| 7,310,759 | B1 | 12/2007 | Carmichael et al. |
| 7,383,479 | B1 | 6/2008 | Carmichael et al. |
| 7,406,673 | B1 | 7/2008 | Patterson et al. |
| 7,512,871 | B1 | 3/2009 | Carmichael et al. |
| 7,620,883 | B1 | 11/2009 | Carmichael et al. |
| 2007/0176627 | A1* | 8/2007 | Ng et al. ................ 326/14 |

OTHER PUBLICATIONS

Gusmao De Lima Kastensmidt, Fernanda et al., "Designing Fault-Tolerant Techniques for SRAM-Based FPGAs," *IEEE Design & Test of Computers*, Nov. 2004, pp. 552-562, vol. 21, Issue 6, IEEE Computer Society Press, Los Alamitos, California, USA.
Lima, Fernanda et al., "Designing Fault Tolerant Systems into SRAM-based FPGAs," *Proc. of the 40th Design Automation Conference (DAC'03)*, Jun. 2, 2003, pp. 650-655, ACM, New York, New York, USA.

* cited by examiner

*Primary Examiner* — Shawki S Ismail
*Assistant Examiner* — Thienvu V Tran
(74) *Attorney, Agent, or Firm* — LeRoy D. Maunu; Lois D. Cartier

(57) ABSTRACT

A circuit for handling single event upsets includes a plurality of digital clock manager circuits. A plurality of counters are respectively coupled by their inputs to the outputs of the digital clock managers and a reset controller is coupled to the outputs of the counters. The reset controller is configured to determine an expected value of the counters. In response to an output value of one of the counters being less than the expected value, the reset controller triggers a reset of the digital clock manager coupled to the input of the one of the counters. In response to an output value of one of the counters being greater than or equal to the expected value, the reset controller continues operation without triggering a reset of a digital clock manager.

17 Claims, 7 Drawing Sheets

SINGLE EVENT UPSET MITIGATION

FIELD OF THE INVENTION

The present invention generally relates to the field of integrated circuits, and more particularly relates to the detection and correction of single event upsets such as those induced in a programmable integrated circuit operating in a radiation environment.

BACKGROUND

Programmable Logic Devices (PLDs) are Integrated Circuits (ICs) that are user configurable and capable of implementing digital logic operations. There are several types of PLDs, including Field Programmable Gate Arrays (FPGAs) and Complex Programmable Logic Devices (CPLDs). CPLDs typically include several function blocks that are based on the well-known programmable logic array (PLA) architecture with sum-of-products logic, and include a central interconnect matrix to transmit signals between the function blocks. Signals are transmitted into and out of the interconnect matrix through input/output blocks (IOBs).

The input/output function of the IOBs, the logic performed by the function blocks, and the signal paths implemented by the interconnect matrix are all controlled by configuration data stored in configuration memory of the CPLD. FPGAs include configurable logic blocks (CLBs) arranged in rows and columns, IOBs surrounding the CLBs or interspersed with the columns of CLBs, and programmable interconnect lines that extend between the rows and columns of CLBs. Each CLB includes look-up tables and other configurable circuitry that is programmable to implement a portion of a larger logic function. The CLBs, IOBs, and interconnect lines are configured by data stored in a configuration memory of the FPGA.

PLDs have become popular for implementing various logic functions in electronic systems that, in the recent past, were typically implemented by smaller (<100,000 gates) application specific integrated circuits (ASICs). Such functions include glue logic, state machines, data bus logic, digital signal processors and protocol functions, for example. Early PLDs often provided insufficient capacity to implement these functions, so the significant investment of time and money to design, layout and fabricate an ASIC for these functions was justified.

However, recent advances in semiconductor and PLD technologies have produced PLDs with the necessary speed and capacity to implement these functions in most applications. Because PLDs are relatively inexpensive and can be programmed in as little as a few hours, the expense associated with the design, layout and fabrication of ASICs has become harder to justify. Further, the reprogrammability of many PLDs makes them even more attractive than ASICs because it is possible to update (reconfigure) PLDs, whereas ASICs must be replaced and expensive new masks generated for the new ASIC designs.

The versatility of reprogrammable PLDs is advantageous in applications such as aerospace, where remote reconfiguration is preferred over physical replacement. However, many aerospace applications expose components to environments where radiation is present, which can cause an error in a PLD known as a single event upset (SEU). A radiation environment contains charged particles that interact with silicon atoms. When a single heavy ion strikes a silicon substrate it loses energy through the creation of free electron hole pairs. This results in a dense ionized track in the local region, generating a current pulse that can upset the circuit. This is known as a single upset event. When a SEU occurs, the result may be transient or permanent.

Reprogrammable PLDs are configured with memory cells that determine how the device will configure each CLB. When a single particle hits a configuration memory cell, the resulting current pulse can trigger a transistor of the configuration memory cell to pass current and invert the value stored in the memory cell. This is referred to as a permanent configuration fault, because the configuration value within the memory cell will remain incorrect until CLB memory is reconfigured. Depending on the logic hit, the generated error may cause permanent variation in the performance of the circuit until the PLD is reconfigured. PLDs are often configured with circuitry to detect whether configuration memory has been altered and recover from the error.

A transient fault occurs when a SEU event generates a current pulse in a signal line. The variation caused by a transient faults following the particle strike will often propagate through the device logic and disappear in a time depending on the logic delay of the circuit. However, in some instances, a transient fault may cause circuits that operate in a plurality of states, such as a digital clock manager (DCM), to enter an incorrect state of operation. When this occurs, the circuit will produce incorrect output until it is reset to the proper state.

Previous techniques to detect and recover from transient SEUs involve the use of triple modular redundancy (TMR). In these techniques, three redundant circuits are implemented in parallel. The outputs of the redundant circuits are compared by a majority voter to detect transient SEUs. The compared value determined to be in the majority is used as output of the circuit to ensure continued correct operation. However, if the state of one of the redundant circuits has changed, TMR cannot provide for fault detection and recovery from additional SEUs unless correct operation of all redundant copies has been restored. To restore SEU fault protection, previous techniques perform a reset of the circuit producing a value in the minority of the compared outputs whenever a discrepancy is detected.

However, a reset does not provide immediate restoration of SEU fault protection. A reset may take several clock cycles to clear and set the circuit to the proper state. By performing a reset when transient faults occur that have not resulted in a change of state, previous TMR techniques unnecessarily place the TMR system into an unprotected state while the reset is being performed.

The present invention may address one or more of the above issues.

SUMMARY

In one embodiment of the present invention, a circuit for handling single event upsets is provided. The circuit includes first, second and third, digital clock manager circuits. A plurality of counters are coupled by their inputs to the outputs of the first, second third digital clock managers, respectively and a reset controller is coupled to the outputs of the counters. The reset controller is configured to determine an expected value of the counters. In response to an output value of one of the counters being less than the expected value, the reset controller triggers a reset of the digital clock manager coupled to the input of the one of the counters. In response to an output value of one of the counters being greater than or equal to the value expected, the reset controller continues operation without triggering a reset of a digital clock manager.

In another embodiment, a method is provided for handling single event upsets in a circuit. Clock cycles output by each of the first, second, and third digital clock manager circuits are counted with respective counters and the outputs from the digital clock manager circuits are compared. In response to a discrepant output from one of the first, second, and third digital clock managers, an expected value of the respective counters coupled to the digital clock managers is determined. The expected value is compared with an output value from the counter coupled to the one of the digital clock managers. In response to the expected value being greater than the output value of one of the counters coupled to the one of the digital clock managers, a reset of the digital clock corresponding to the counter containing the discrepancy is triggered. In response to the expected value being less than the output value of the counter having the discrepant output, operation is continued without triggering a reset of the discrepant digital clock manager.

In yet another embodiment, a circuit is provided for handling single event upsets. The circuit includes a plurality of digital clock manager circuits, including at least a first digital clock manager and a second digital clock manager. Inputs of a plurality of counters are coupled respectively to outputs of the plurality of digital clock managers. A reset controller is coupled to the output of the counters. In response to an output value of the counter corresponding to the first digital clock manager reaching an enable value, the reset controller compares the output value of the counter corresponding to the second digital clock manager to an expected value. In response to an output value of the compared counter being less than the expected value, the reset controller triggers a reset of the first digital clock manager. In response to an output value of the compared counter being greater than or equal to the expected value, the reset controller continues operation without triggering a reset of the first digital clock manager.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
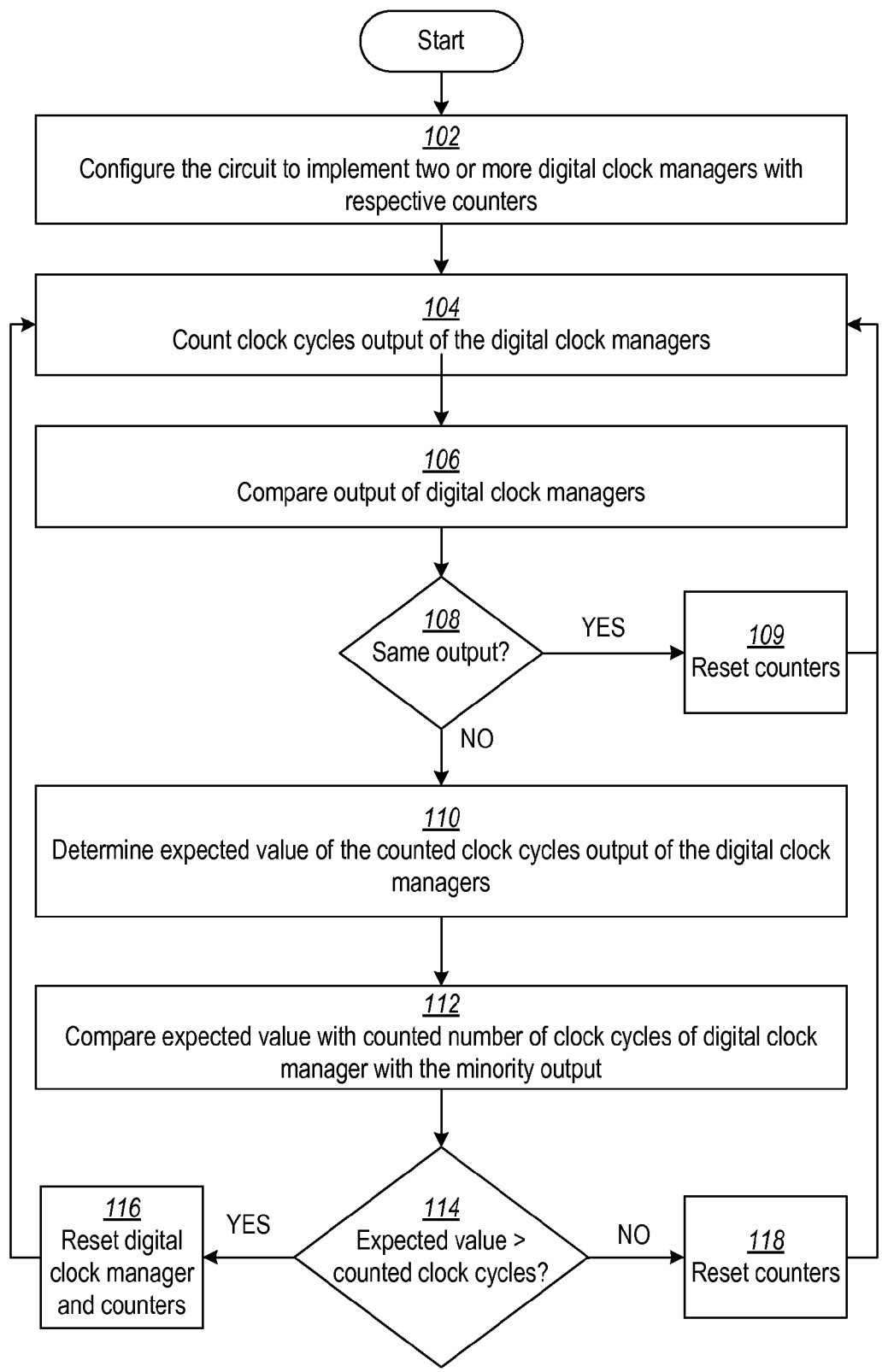
FIG. 1 shows a flowchart of a process for handling single event upsets in a circuit with a digital clock manager, in accordance with various embodiments of the invention.

The present invention is applicable to a variety of systems and circuits. An appreciation of the present invention is presented by way of specific examples utilizing Programmable Logic Devices (PLDs) such as Field Programmable Gate Arrays (FPGAs). However, the present invention is not limited by these examples, and can be applied to any appropriate circuit subject to single event upsets.

Transient errors occur when single even upsets (SEUs) strike signal lines of a circuit design. The effect may be transient in that any error introduced to the logic passes out of the system without intervention, through the data propagation of normal operation. Generally, SEU effects are mitigated by implementing three redundant copies of a circuit along with a majority voter to ensure that a correct value is output while a transient fault is present in one of the redundant copies. This is known as triple modular redundancy (TMR). When an SEU occurs, the output of one of the redundant copies will be inconsistent with output generated by the others. The majority voter determines the correct value to use as output and determines the copy of the circuit that produced incorrect output. It is understood that majority voting and minority voting may be used interchangeably to trigger the reset of the faulty circuit with minor additions to logic of the circuit in order to select the majority or minority value. For example, a majority value can be used to trigger the reset of the minority input by performing an XOR operation of the minority value with the input followed by an AND operation with each of the input. If the input is not within the majority, the XOR acts as an enable to the AND operation, which can be used to trigger reset.

Digital clock manager circuits (DCM) are commonly used in integrated circuits to regulate the system clock of a device. When a transient SEU strikes a DCM or output signal line, the transient fault may either appear as an additional clock cycle, which can be disregarded, or may place the DCM into an incorrect state, requiring a reset of the state machine before the DCM will produce correct output. Traditional SEU mitigation techniques do not detect whether the state of a DCM has been altered as the result of a transient fault. Instead, the DCM struck by the SEU is assumed to be inoperable and is either reset or reconfigured from configuration memory.

However, a reset does not provide immediate restoration of SEU fault protection. A reset may take several clock cycles to clear and set the circuit to the proper state. If a second SEU occurs before the reset is completed, the majority voter will not have the necessary number of inputs to compare and determine a majority value. In cases where a transient fault does not cause the DCM to change state, the DCM producing output in the majority could disregard the transient fault instead of resetting and operation can proceed as usual. By performing a reset for transient faults that have not resulted in a change of state, previous TMR techniques unnecessarily place the TMR system into an unprotected state while the reset is being performed.

The present invention improves reliability of SEU detection circuit by detecting transient faults and determining whether the state of a circuit has been changed and requires a reset. By avoiding unnecessary resets, the invention reduces the time in which the mitigation circuit is vulnerable to SEUs.

The various embodiments of the present invention determine whether a transient fault has altered the state of a DCM and requires a reset, by counting the number of clock cycles output by each redundant DCM and comparing the counted values to the expected value of clock cycles that would occur under correct operation.

If an SEU transient hits a DCM or output signal line and does not alter the state of the DCM, the transient fault is expected to raise or lower the generated clock signal during a cycle, creating an additional rising edge and falling edge. These additional edges result in the number of counted clock cycles being greater than expected. If, however, the SEU transient has altered the state of operation of the DCM, the DCM will typically stop generating an output clock signal and will result in the number of counted clock cycles being less than expected. If the frequency of the clock signal generated by the DCM increases or decreases, it is the result of a permanent fault in the configuration memory. Additional circuitry is typically provided to detect and recover from permanent SEU configuration memory faults. Therefore, configuration memory faults are ignored by the invention, because they are handled by existing circuitry.

Therefore, when an SEU is detected, the mitigation system in embodiments of the present invention will trigger a reset of the proper DCM if the counted number of clock cycles is less than expected. If the counted number of clock cycles is greater than expected, the transient fault is ignored and no reset is triggered. In either case, the correct output can be selected by majority voter circuitry to ensure continuous operation.

The embodiments of the invention are understood to be applicable to the mitigation of SEUs in a variety of circuits. The term "DCM", as used herein, includes any circuit that operates in a plurality of states and produces periodic output.

FIG. 1 shows a flowchart of one process for handling single event upsets in a circuit with a digital clock manager, in accordance with various embodiments of the invention. The circuit is configured to implement two or more digital clock managers with respective counters at step 102. During operation of the circuit, clock cycles of each DCM are counted at step 104. If no discrepancy is detected between the compared outputs, the counters are reset. The comparison is repeated until a discrepancy is detected. If the outputs of the compared DCMs are not the same at step 108, an SEU has been detected. The expected value of the counted clock cycles is determined at step 110. The expected value is compared with the value of counted clock cycles from the digital clock manager with the minority output. If the expected value is greater than the counted value at decision step 114, the DCM with minority output is reset along with the counters at step 116. If the expected value is less than or equal to the counted value, the transient fault is ignored and counters are reset at step 118.

Figure 2:
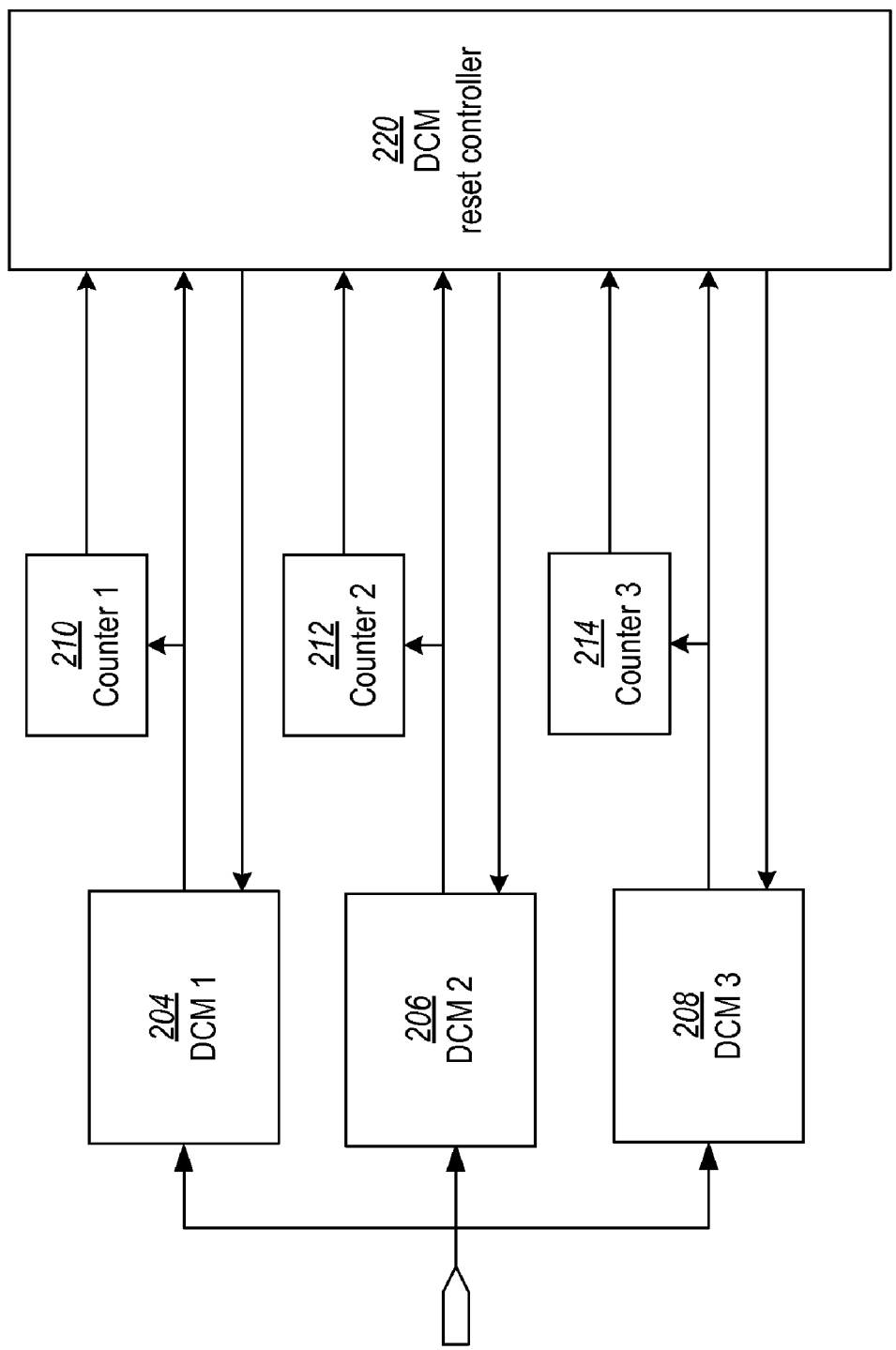
FIG. 2 shows a block diagram of a circuit for handling single event upsets in DCMs.

FIG. 2 shows a block diagram of a circuit for handling single event upsets which implements triple modular redundancy. Three DCMs 204, 206, and 208 are implemented in the circuit. The generated clock of each DCM is output to respective counters 210, 212, or 214, and reset controller 220. The number of clock cycles counted by each counter is output to the reset controller 220. Reset controller 220 determines the correct clock cycle of the DCMs and, when a single event upset occurs, determines the DCM in which the upset occurred and whether a reset is required. Reset control signals are output from controller 220 to each DCM (not shown). It should be noted that reset controller 220 contains detection circuitry to determine whether the DCM state has changed and reset circuitry to trigger a reset of a faulty DCM. In some embodiments, these components are implemented in separate reset controllers for each DCM.

In various embodiments of the invention the value of the counters are checked after a pre-determined number of clock cycles. The counted value is then checked to determine if the respective DCM has stopped generating a clock signal and requires a reset.

Figure 3:
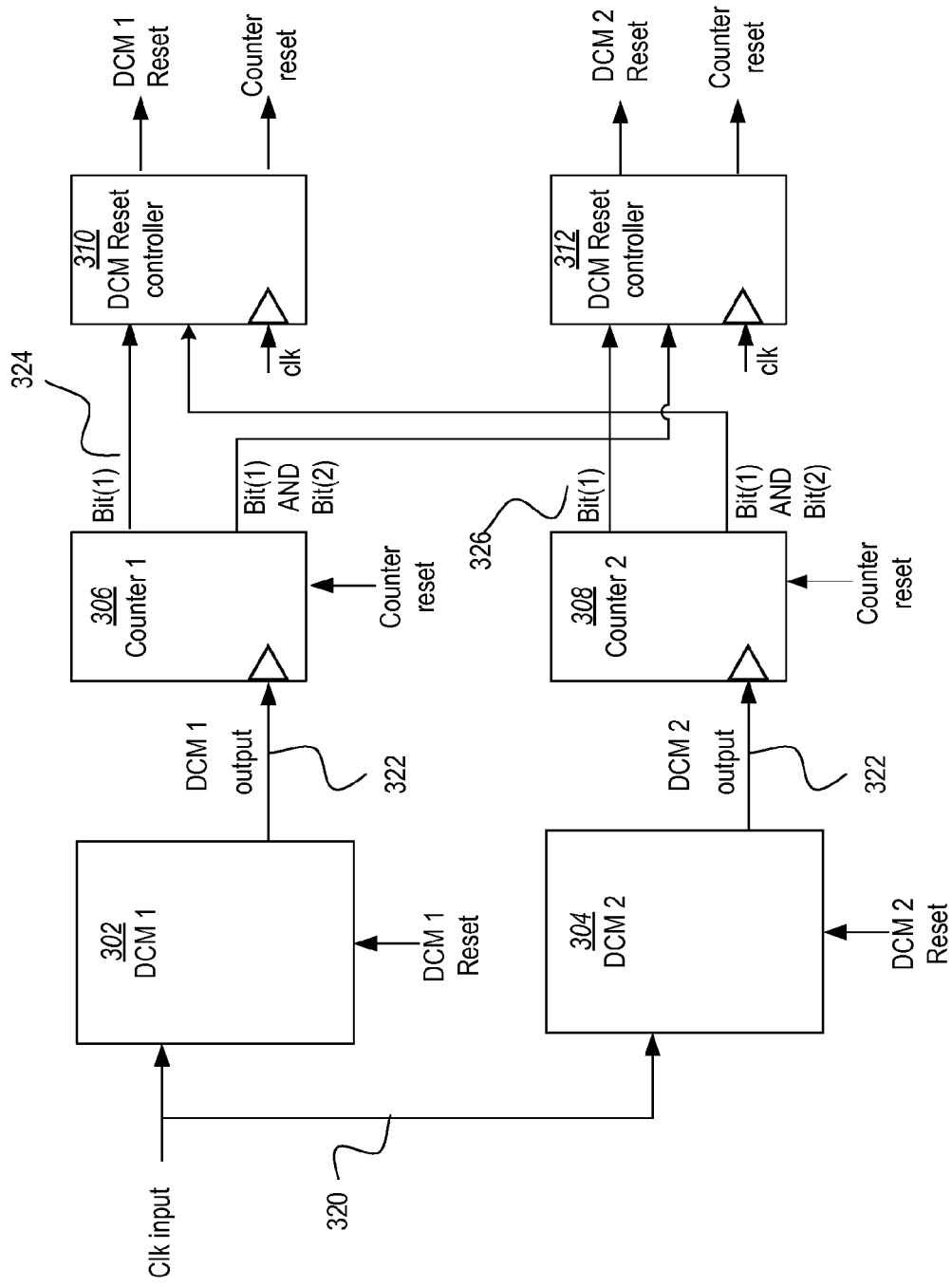
FIG. 3 illustrates a block diagram of a circuit for handling single event implemented with double modular redundancy (DMR) and checked after a pre-determined number of clock cycles, in accordance with various embodiments of the invention.

FIG. 3 Illustrates a block diagram of a circuit for handling single event implemented with double modular redundancy (DMR) and checked after a pre-determined number of clock cycles in accordance with various embodiments of the invention. The circuit includes two DCM circuits 302 and 304, which receive a common clock input 320 as shown. In some implementations, a separate clock may alternately be used to drive each DCM. Each DCM generates a regulated clock output 322, which is received by respective counters 306 and 308. In this implementation, the output of a counter is checked by a DCM reset controller 310 or 312 when the other counter reaches the binary value of "11." DCM reset controllers 310 or 312 are driven by a clock independent of the DCM being checked. For example, DCM reset controller 310 may be driven by DCM 2 output 322 or by clock input 320.

Operation of this implementation can be shown by example. If no error has occurred, counters 306 and 308 will reach the binary value of "11" at the same time. Each respective DCM controller will check bit-1 of the counted value. Because the counted value is three, bit-1 will be enabled and no error will be detected.

If a transient error occurs in DCM 302 that does not require a reset, an extra clock cycle will be counted by counter 306. Counter 306 will therefore reach the binary value of "11" after the second clock cycle and will enable DCM reset controller 312. At this point counter 308 will have a value of two. Bit-1 will be enabled, and DCM reset controller, will not detect a transient requiring a reset. As a result, DCM reset controller 310 will trigger a reset of the counters and continue normal operation. Because the counters are reset, DCM reset controller 310 is not enabled and the transient error occurring in DCM 302 is properly ignored.

If a transient error occurs in DCM 302 that does require a reset, DCM 302 will have stopped generating a clock signal and counter 306 will maintain a counted value of zero. When the other counter 308 reaches the binary value "11," DCM reset controller 310 will be enabled. At this time, counter output bit-1 will be zero. In response, DCM reset controller 310 will signal the reset of DCM 302 and signal the reset of both counters.

It should be noted that it is possible for a DCM 302 to stop generation of a clock signal after the associated counter has reached a binary value of "10." In this scenario, the required reset would not be detected on the current check. However, after counters are reset and the other counter 308 reaches a value to enable DCM reset controller 310, the DCM in error will have a counted number of clock cycles equal to zero. A required reset will be detected and the DCM in error will be reset accordingly.

In this example implementation, 2-bit counters are used and are checked after three clock cycles. It is understood that any size counter may be used and can be checked after any number of cycles that can be held by the counter. It is further understood that this implementation is equally applicable to TMR. In a TMR implementation, a first counter would enable the comparison of the second counter, the second counter would enable the comparison of a third counter, and the third counter would enable the comparison of the first counter.

Figure 4:
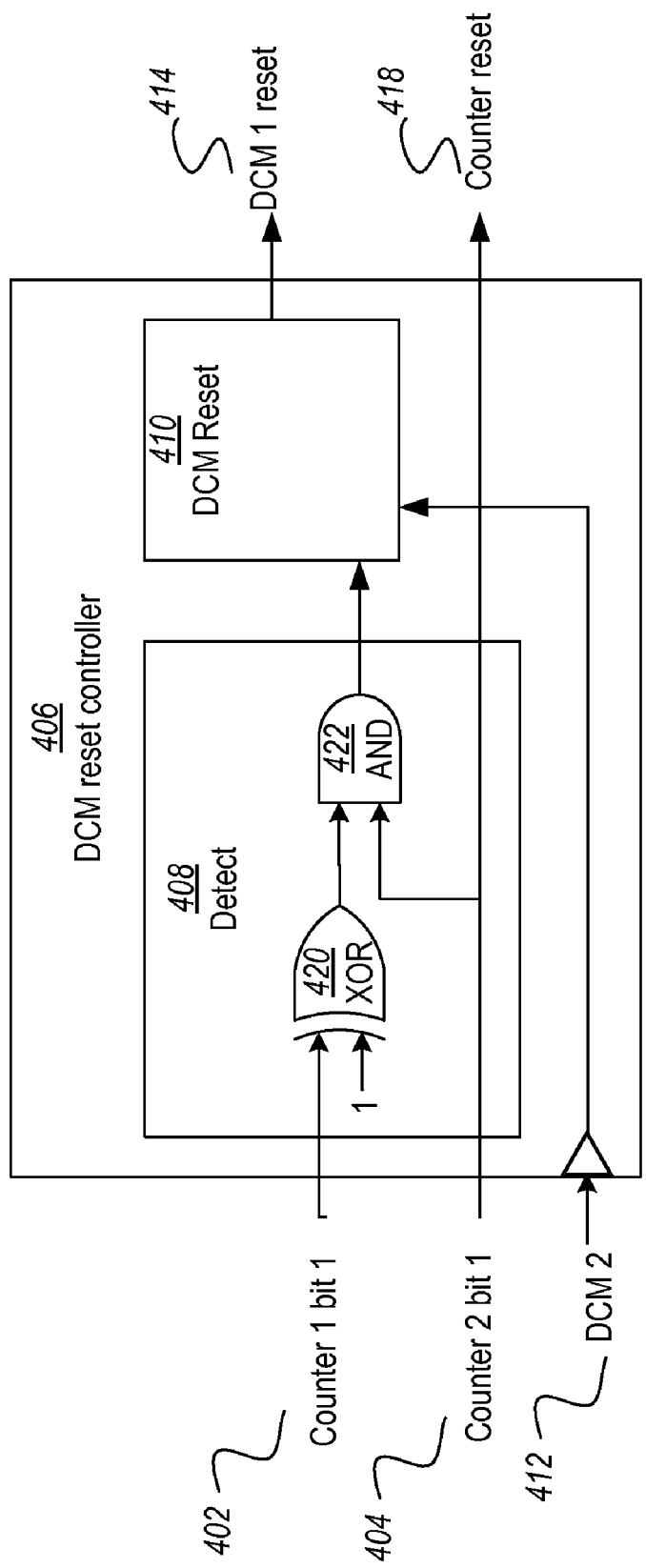
FIG. 4 shows a block diagram of one example implementation of the DCM reset controller shown FIG. 3.

FIG. 4 shows a block diagram of one example implementation of the DCM reset controller 310 shown in FIG. 3. DCM reset controller 406 contains a detect circuit 408 to detect transient faults that upset the state of a DCM. Detect circuit 408 compares the value 402 of bit-1 output of counter_1 (not shown) to a constant value of "1" at XOR gate 420. The output of XOR gate 420 is received by AND gate 422, which is used as a reset enable. In this example, the detect circuit is enabled when the binary value 404 of counter_2 (not shown) is equal to "11." Therefore, the expected value of counter_1 is the value of either "10" or "11" depending on the when the DCM reset controller 406 is enabled. Thus a reset is required if the value of the counter is less than the value of two. XOR gate 420 compares output bit-1 402 of counter_1 to a constant value of one to determine whether counter_1 has stopped generating a clock signal. If counter_1 has not reached the value of two, XOR gate 420 sends a signal to AND gate 422.

If the value of counter_1 is less than two when enable input 404 is set, AND gate 422 outputs a reset signal to DCM reset circuit 410. DCM reset 410 uses independent clock input 412 to generate the command required to reset the DCM used. Depending on the DCM, the command may be a serially encoded sequence or may alternately require that a signal be set high for a certain number of clock cycles. For example, Xilinx Virtex-4® requires a high signal line for a minimum of eight clock cycles to trigger a reset. After the Virtex-4 DCM has been reset, the DCM reset controller block may need to be placed in non-detection mode while the DCM attempts to relock its outputs in order to prevent continuous reset of the DCM.

Figure 5:
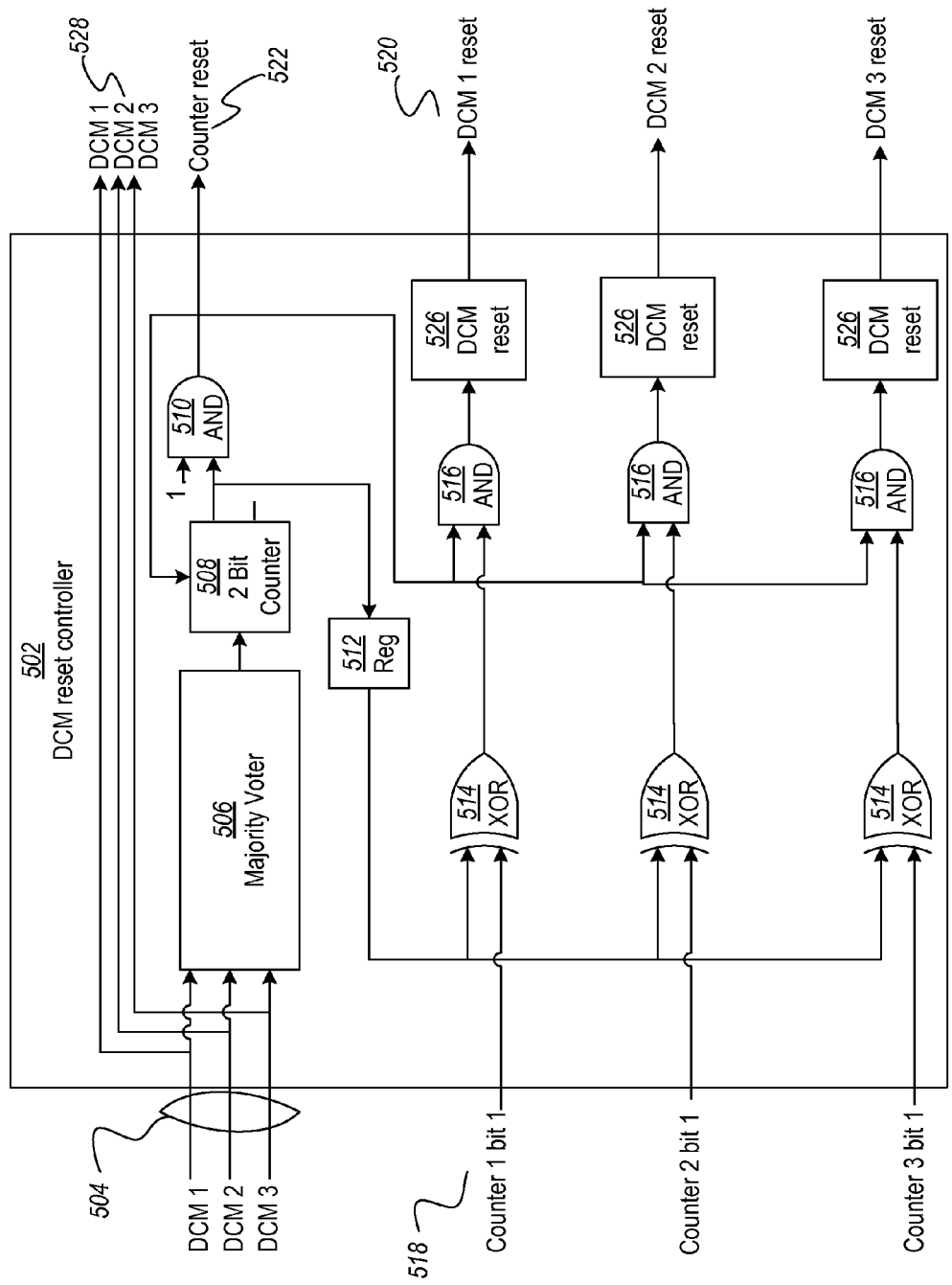
FIG. 5 shows a block diagram of another example implementation of the reset controller circuit shown in FIG. 2, in accordance with various embodiments of the invention.

FIG. 5 shows a block diagram of another example implementation of the reset controller circuit shown in FIG. 2 in accordance with various embodiments of the invention. In this example implementation, the detection and reset circuits corresponding to three DCMs are implemented within a single DCM reset controller 502. In this implementation, a majority voter 506 is used to determine a correct clock cycle output. The correct clock cycle output is counted by a counter 508 to determine the expected value at any given time.

Generated clock signals 504 of DCM circuits (not shown) are input into majority voter 506. In various embodiments, clock signal inputs 504 are forwarded to an output 528 as shown. In some embodiments, additional circuitry is relied upon to perform majority voting and select the correct signal to as the actual output. In other embodiments, the output of majority voter 506 may be used as a trusted value in the overall circuitry.

The majority voter outputs the majority clock to 2-bit counter 508. The most significant bit of the 2-bit counter is output to register 512. When counter 508 reaches the value of two, the most significant bit of the counters are compared with XOR gates 514 to determine if the value of each counters is less than the value of two. If they are, a signal is output from the XOR gate to the connected enable AND gate 516. When enabled, AND gates 516 output received reset signals to DCM reset circuits 526. Reset circuits 526 generate the appropriate signal to trigger reset of the connected DCM. When counter 508 has reached the value of two, AND gate 510 enables reset of the counters 522, and enables DCM reset output 520 at AND gates 516.

Figure 6:
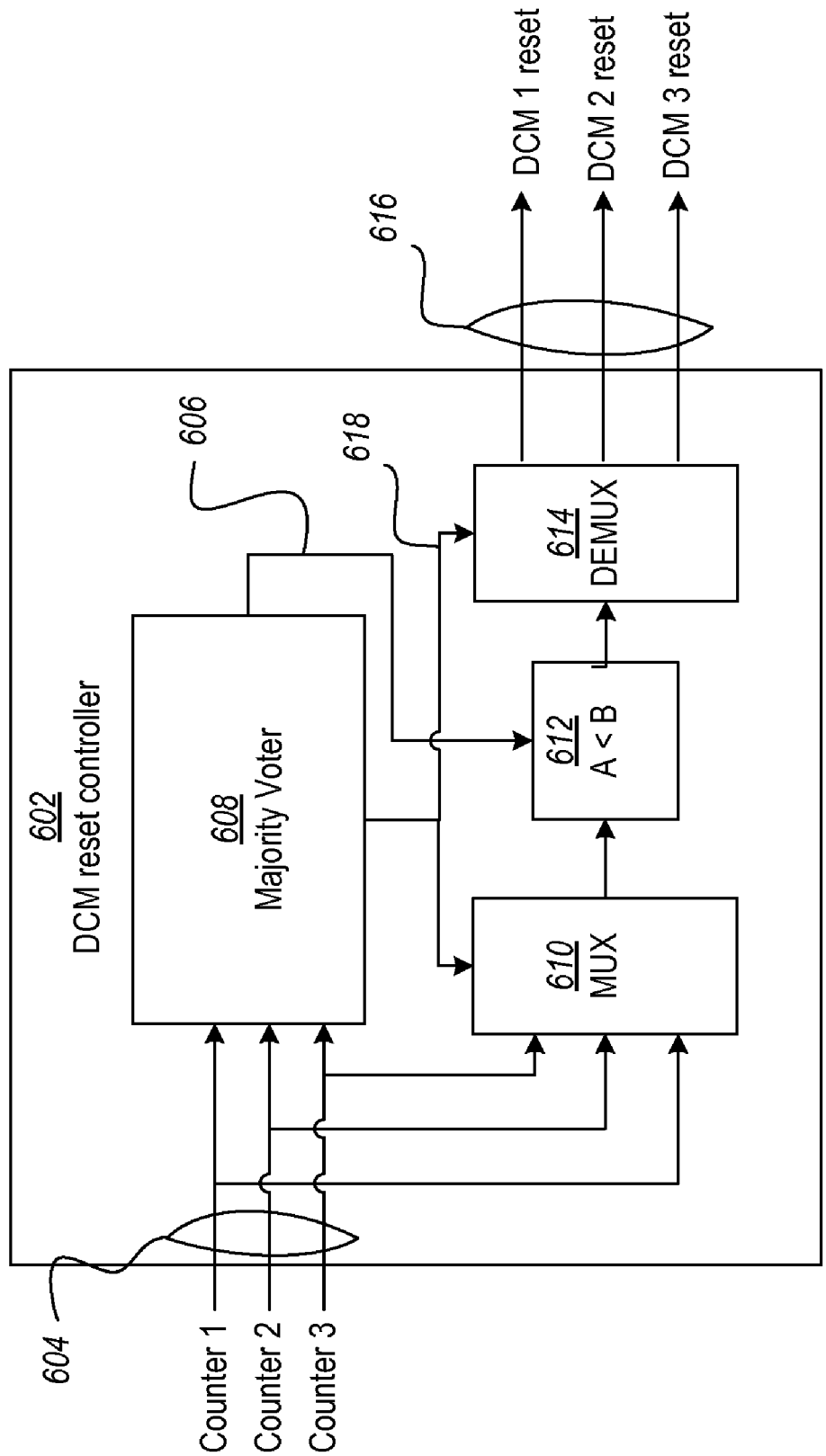
FIG. 6 shows a block diagram of yet another example implementation of the reset controller circuit shown in FIG. 2, in accordance with various embodiments of the invention.

FIG. 6 shows a block diagram of yet another example implementation of the reset controller circuit shown in FIG. 2 in accordance with various embodiments of the invention. In this implementation, the majority value of the counters is used as the expected counter value. Reset controller 602 contains majority voter 608 to determine the correct value of the counters. The majority voter outputs the correct value on line 606 and the address of the minority counter on line 618 in response to a discrepancy. MUX 618 selects as input the counter output 604 corresponding to address on line 618. The selected output is compared with the correct value by comparison circuit 612. If the selected counter output is lower than the correct value, a reset signal is output to DEMUX 614, which directs the reset signal to the correct DCM through lines 616.

Figure 7:
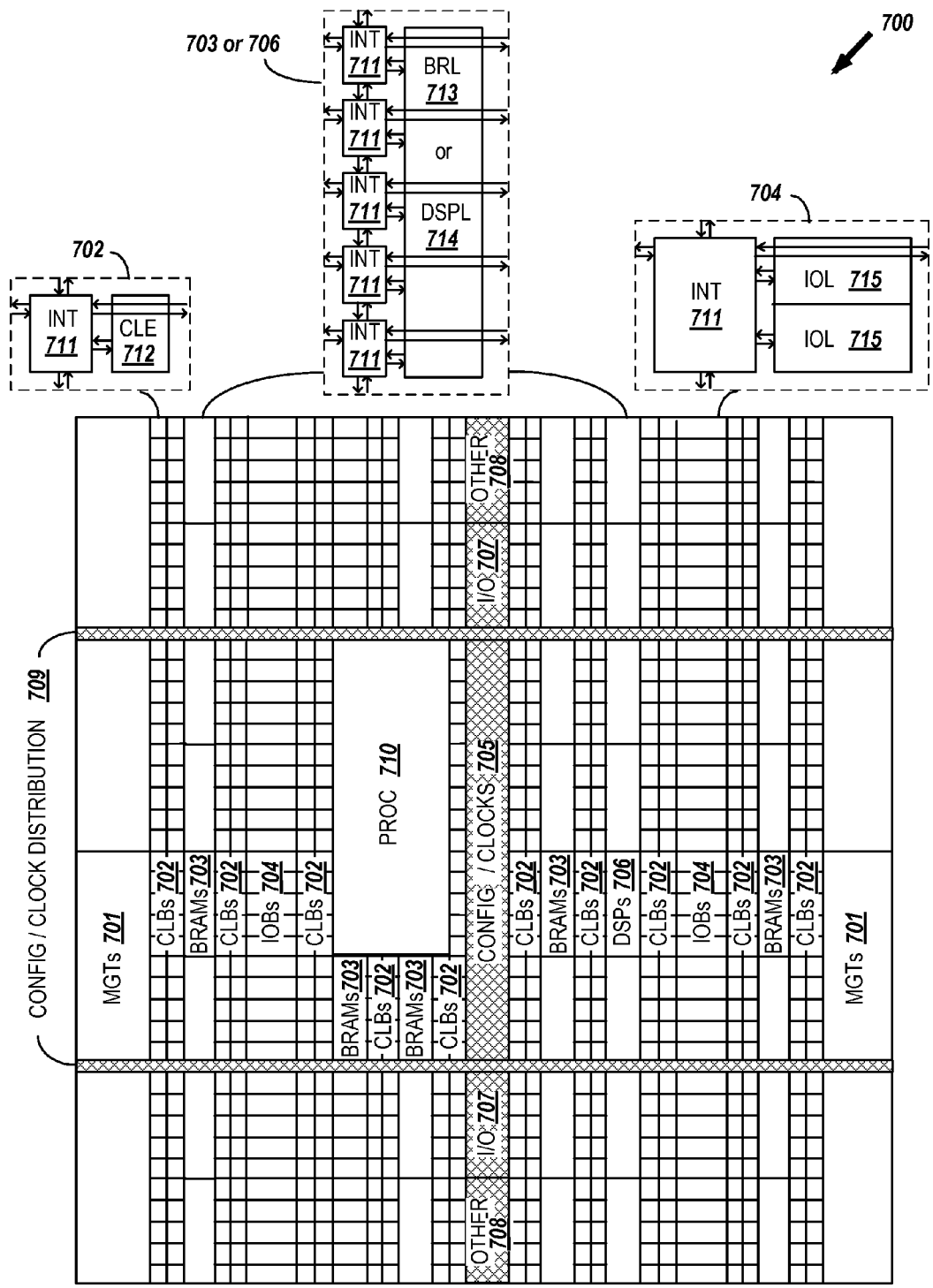
FIG. 7 is a block diagram of a programmable integrated circuit, specifically a field programmable gate array (FPGA), that may be configured to implement DCM mitigation in accordance with various embodiments of the invention.

FIG. 7 is a block diagram of a programmable integrated circuit, specifically a field programmable gate array (FPGA), that may be configured to implement DCM mitigation in accordance with various embodiments of the invention. FPGAs can include several different types of programmable logic blocks in the array. For example, FIG. 7 illustrates an FPGA architecture (700) that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), a reconfiguration port (not shown), specialized input/output blocks (I/O 707), for example, e.g., clock ports, and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An 10B 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/ logic implementations included at the top of FIG. 7 are purely exemplary. For example, in an actual FPGA more than one adjacent column of CLBs is typically included wherever the CLBs appear, to facilitate the efficient implementation of user logic.

The present invention is thought to be applicable to a variety of systems and circuits for SEU mitigation. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit for handling single event upsets in a circuit arrangement, comprising:
   first, second, and third digital clock manager circuits;
   a plurality of counters having inputs coupled to outputs of the first, second, and third digital clock managers, respectively, each counter outputting a respective counter value indicating a number of transitions of a signal output from the respective digital clock manager circuit; and
   a reset controller coupled to the outputs of the counters, wherein the reset controller is configured to:
      determine an expected value of the counters after a pre-determined number of clock cycles, the expected value being equal to the pre-determined number of clock cycles;
      in response to the counter value of one of the counters being less than the expected value, trigger a reset of the digital clock manager circuit coupled to the input of the one of the counters; and
      in response to the counter value of one of the counters being greater than the expected value, continue operation without triggering a reset of the digital clock manager circuit coupled to the input of the one of the counters.

2. The circuit of claim 1, wherein:
   the reset controller is further coupled to the outputs of the first, second, and third digital clock manager circuits; and
   the reset controller is further configured to:
      compare values of the signals output from the digital clock manager circuits; and
      determine a majority value from the compared values of the signals output from the digital clock manager circuits.

3. The circuit of claim 2, wherein:
   the expected value is determined in response to a discrepancy in the compared values of the signals output from the digital clock manager circuits; and
   the expected value is the signal value that is output by a majority of the digital clock manager circuits.

4. The circuit of claim 2, wherein the reset controller is further configured to output the determined majority value.

5. The circuit of claim 1, wherein:
   the reset controller is further configured to compare the counter values of the counters;
   the expected value is determined in response to a discrepancy in the compared counter values; and
   the expected value is the counter value that is output by a majority of the counters.

6. The circuit of claim 1, wherein the counters are two bit counters.

7. The circuit of claim 1, wherein the predetermined number of clock cycles is less than a maximum output value of the counters.

8. The circuit of claim 1, wherein:
   each counter includes a reset port coupled to a counter reset port of the reset controller; and
   each counter is configured to maintain a maximum output value once reached until the counter is reset by the reset controller.

9. The circuit of claim 1, wherein the digital clock managers are implemented in programmable logic.

10. The circuit of claim 1, wherein the expected value is any non-zero value.

11. A method for handling single event upsets in a circuit, comprising:
    counting cycles of clock signals output by each of first, second, and third digital clock manager circuits with respective counters;
    comparing the clock signals output from the digital clock manager circuits; and
    in response to a discrepant output clock signal from one of the first, second, and third digital clock manager circuits relative to output clock signals from the other two digital clock manager circuits:
       determining an expected value of the respective counter coupled to the one of the digital clock manager circuits;
       comparing, after a predetermined number of clock cycles, the expected value with an output counter value from the counter coupled to the one of the digital clock manager circuits;
       wherein the expected value is determined to be equal to the predetermined number of clock cycles;
       in response to the expected value being greater than the output counter value of the counter coupled to the one of the digital clock manager circuits, triggering a reset of the one of the digital clock manager circuits; and
       in response to the expected value being less than the output counter value of the counter coupled to the one of the digital clock managers, continuing operation without triggering a reset of the one of the digital clock manager circuits.

12. The method of claim 11, wherein the comparing of output of the digital clock manager circuits includes comparing the output counter values of the counters.

13. The method of claim 11, wherein the determining the expected value includes reading the output counter value of the counter coupled to one of the digital clock manager circuits that output a clock signal that is equal to the clock signal output by a majority of the digital clock manager circuits.

14. The method of claim 11, further comprising:
    resetting the respective counters after the step of comparing the expected value with the output counter value.

15. The method of claim 14, wherein the counters are two bit counters.

16. The method of claim 14, wherein the predetermined number of clock cycles is less than a maximum value that the counters are capable of outputting.

17. The method of claim 14, wherein the counters are configured to not roll over to zero once counter capacity is met unless the counter is reset.

* * * * *